(12) United States Patent
Hu et al.

(10) Patent No.: US 7,989,505 B2
(45) Date of Patent: Aug. 2, 2011

(54) SYNTHESIS OF COLUMNAR HYDROGEL COLLOIDAL CRYSTALS IN WATER-ORGANIC SOLVENT MIXTURE

(75) Inventors: Zhibing Hu, Denton, TX (US); Jun Zhou, Denton, TX (US); Tong Cai, Denton, TX (US); Shijun Tang, Denton, TX (US); Manuel Marquez, Midlothian, VA (US)

(73) Assignee: University of North Texas, Denton, TX (US)

( * ) Notice: Subject to any disclaimer, the term of this patent is extended or adjusted under 35 U.S.C. 154(b) by 1315 days.

(21) Appl. No.: 11/524,703

(22) Filed: Sep. 21, 2006

(65) Prior Publication Data
US 2010/0261814 A1  Oct. 14, 2010

Related U.S. Application Data

(60) Provisional application No. 60/720,008, filed on Sep. 23, 2005.

(51) Int. Cl.
*C08J 3/05*  (2006.01)
*C08J 3/075*  (2006.01)
*B01F 3/12*  (2006.01)
(52) U.S. Cl. .......... 516/99; 516/102; 516/104; 516/106
(58) Field of Classification Search ............. 252/299.01, 252/299.5; 516/102, 99, 104, 106
See application file for complete search history.

(56) References Cited

U.S. PATENT DOCUMENTS

| | | | |
|---|---|---|---|
| 4,912,032 A | 3/1990 | Hoffman et al. |
| 5,532,006 A | 7/1996 | Lauterbur et al. |
| 6,165,389 A | 12/2000 | Asher et al. |
| 2004/0018160 A1 | 1/2004 | Hu et al. |

FOREIGN PATENT DOCUMENTS
EP  0 482 394 A2  4/1992

OTHER PUBLICATIONS

Cathcart JM, Lyon LA, Weck M, Bock RD. Application of Microgels for Optical Tagging. Int. Soc. Opt. Eng. 2004;5403(1):774-781.
Hellweg T, Dewhurst CD, Bruckner E, Kratz K, Eimer W. Colloidal Crystals Made of Poly(N-isopropylacrylamide) Microgel Particles. Colloid and Polymer Science. Oct. 2000;278(1):972-978.
PCT Notification of Transmittal of the International Search Report and the Written Opinion of the International Searching Authority, or the Declaration dated Mar. 15, 2007.

*Primary Examiner* — Shean C Wu
(74) *Attorney, Agent, or Firm* — Jackson Walker L.L.P.

(57) ABSTRACT

The compositions of hydrogel colloidal crystals are made from mixing an aqueous suspension of poly-N-isopropylacrylamide ("PNIPAM")-co-allylamine microgels with dichloromethane, forming a PNIPAM-co-allylamine/dichloromethane mixture. The PNIPAM-co-allylamine/dichloromethane mixture is incubated for a period of time at a given temperature, forming the colloidal crystal material. The colloidal crystals can be stabilized by diffusing a glutaric dialdehyde solution into the colloidal crystal material. The concentration of polymer matrix microgels can determine the orientation of random or columnar crystals.

20 Claims, 7 Drawing Sheets

US 7,989,505 B2

SYNTHESIS OF COLUMNAR HYDROGEL COLLOIDAL CRYSTALS IN WATER-ORGANIC SOLVENT MIXTURE

RELATED APPLICATIONS

This application claims priority to U.S. Provisional Patent Application, Ser. No. 60/720,008, entitled "SYNTHESIS OF COLUMNAR HYDROGEL COLLOIDAL CRYSTALS IN WATER-ORGANIC SOLVENT MIXTURE" filed on Sep. 23, 2005, having Hu, Thou, Cai, Tang and Marquez, listed as the inventor(s), the entire content of which is hereby incorporated by reference.

STATEMENT OF RIGHTS TO INVENTIONS MADE UNDER FEDERALLY SPONSORED RESEARCH

This invention was made in part during work supported by a grant from the Army Research Office Grant No. DAAD 19-0101-0596. The government may have certain rights in the invention.

BACKGROUND

The present invention pertains to compositions of random or columnar hydrogel colloidal crystals in water-organic solvent mixture and methods of making such crystals. More specifically, the compositions of hydrogel colloidal crystals are made from mixing an aqueous suspension of poly-N-isopropylacrylamide ("PNIPAM")-co-allylamine microgels with dichloromethane, forming a PNIPAM-co-allylamine/dichloromethane mixture. The PNIPAM-co-allylamine/dichloromethane mixture is incubated for a period of time at a given temperature, forming the colloidal crystal material. The colloidal crystals can be stabilized by diffusing a glutaric dialdehyde solution into the colloidal crystal material. The concentration of polymer matrix microgels can determine the orientation of random or columnar crystals.

Hydrogels. Gels are three-dimensional macromolecular networks that contain a large fraction of solvent within their structure and do not dissolve. When the trapped solvent is water, the gels are termed "hydrogels." Hydrogels exhibit high water content and are soft and pliable. A hydrogel can be also defined as a colloidal gel in which water is the dispersion medium of the colloid having a mixture with properties between those of a solution and fine suspension. A colloid gel is a colloid in a more solid form than a sol. The properties of hydrogels are similar to natural tissue, and therefore hydrogels are extremely biocompatible and are particularly useful in biomedical and pharmaceutical applications. As such, hydrogels can be responsive to a variety of external, environmental conditions. A unique physical property of some hydrogel systems is reversible volume changes with varying pH and temperature.

Generally, polymer gels can be formed by the free radical polymerization of monomers in the presence of a reactive crosslinking agent and a solvent. They can be made either in bulk or in nano- or micro-particle form. The bulk gels are easy to handle, but usually have very slow swelling rates and amorphous structures arising from randomly crosslinked polymer chains. In contrast, gel nanoparticles react quickly to an external stimulus, have organized local structure, but suffer from practical size limitations.

Responsive polymer gels can be made by the co-polymerization of two different monomers, by producing interpenetrating polymer networks or by creating networks with microporous structures. These processes are disclosed in U.S. Pat. Nos. 4,732,930, 5,403,893, and 6,030,442, respectively. Finally, a microparticle composition and its method of use in drug delivery and diagnostic applications have also been disclosed in U.S. Pat. No. 5,654,006.

Hydrogels usually consist of randomly crosslinked polymer chains and contain a large amount of water occupying interstitial spaces of the network, resulting in amorphous structures. Without the addition of a coloring agent or opacifier, hydrogels are clear and colorless when they are fully swollen in water. To create colors in hydrogel systems, there are two major approaches in the prior art as disclosed in U.S. Pat. Nos. 6,165,389, 6,014,246 and 6,187,599. The first is to form a poly(N-isopropylacrylamide) (P-NIPA) crystalline colloidal fluid in an aqueous media and contain it in a glass cell. The second is to embed a crystalline colloidal array of polystyrene polymer solid spheres in a P-NIPA hydrogel. Both approaches have utilized the unique temperature-responsive property of the P-NIPA, but each has its own limitations. The first material is a colloidal fluid: its crystal structure can be easily destroyed by a small mechanical vibration. The second approach to make colored hydrogels requires the introduction of non-hydrogel solid spheres (polystyrene) as light-diffracting materials.

Crystal Hydrogels. The concept for synthesizing crystal hydrogels based on crosslinking gel nanoparticles was previously described in U.S. patent application Ser. No. 10/295,484 filed by Hu et al., on Nov. 15, 2001 and titled "Synthesis, Uses and Compositions of Crystal Hydrogels," ("the '484 Application"). The '484 Application described nanoparticle networks that exhibit either a uniform color due to a short-range ordered structure or are colorless due to a randomly ordered structure. Additionally, the '484 Application discloses a method for creating hydrogels with ordered crystalline structures that exhibit a characteristic colored opalescence. In addition to the unique optical properties, these materials contain a large amount of water in their crosslinked networks. The manufacturing processes include synthesizing monodispersed hydrogel nanoparticles containing specific reactive functional groups, self-assembly of these particles to form a crystalline structure, and subsequent crosslinking neighboring spheres to stabilize the entire network. Polymerizing a hydrogel monomeric composition around the crystalline structure can enhance the mechanical strength. The resulting network is dimensionally and thermodynamically stabile under various pH and temperature conditions. The color and volume of these crystalline hydrogel networks can reversibly change in response to external stimuli such as temperature, pH and other environmental conditions. The primary scope of this invention relates to environmentally responsive hydrogel nanoparticle networks that exhibit crystalline structures, are opalescent in appearance, are stable under mechanical vibration and temperature fluctuations, and consist of only hydrogel materials without other embedded solid polymer spheres. These new materials may lead to a variety of technological and artistic applications, ranging from sensors, displays, controlled drug delivery devices, jewelry and decorative consumer products. The '484 Application is specifically incorporated herein by reference.

Columnar Hydrogel Colloidal Crystals. Useful methods of obtaining colloidal crystals have been previously developed and include: sedimentation,[1-3] diffusion of base,[4] evaporation,[5] electrostatic repulsion,[6] templated growth,[7] gradient temperature fields,[8] and physical confinements [9] is of paramount importance. Such crystals allow one to obtain useful functionalities not only from colloidal particles but also from the long-range ordering of these particles.[10-12] A useful method of growing large columnar crystals by mixing an aqueous suspension of hydrogel colloids (or microgels) with organic solvent is described herein. The hydrogel colloidal crystals of several centimeters have grown from the top to the bottom along the gravity direction, driven by coalescence of micelles consisting of organic oil droplets coated by many microgels. This is in contrast to a conventional method to form randomly-oriented hydrogel colloidal crystals in pure water with the largest domain size of the order of several minimeters.[13-16]

Columnar crystals of hard spheres have been studied using a sedimentation [3] or a diffuse of base method.[4] In these experiments, the silica spheres were dispersed in an aqueous solution at volume fractions less than the freezing value [3] or in an pH gradient solution [4] to settle down on a flat surface to form columnar crystals. These methods and other previous ones cannot be used for hydrogel colloids. This is because in contrast to silica or polystyrene hard spheres, the hydrogel colloids or microgels investigated in this work contain 97 wt % water. Consequently, the density and the hydrogel colloids refractive index of the microgels closely match up those of the surrounding water, yielding a condition of mini-gravity ($\sim 10^{-2}$g) at room temperature.[16]0 It is difficult, if not impossible, to grow columnar crystals by natural sedimentation of microgels in water. Currently, the major method for preparing hydrogel colloidal crystals has relied on self-assembling hydrogel particles in water, forming randomly oriented crystal domains.[12-16] Hydrogels are well known for their unique hydrophilic and environmentally responsive properties that lead to various applications including controlled drug delivery, artificial muscles, devices and sensors.[17-24] Assembling hydrogel colloids along a single direction could open a new avenue for these applications.

Conventional hydrogels are isotropic materials. That is, their swelling ratio, optical transmission, and molecular diffusion properties are the same along different directions. The isotropic symmetry may be broken only under an external constrain such as stretching or by incorporating liquid crystals into gels. The hydrogel with a columnar crystal structure, as described herein, can behave differently along the crystal growth axis and along the direction that is perpendicular to the growth axis. For example, it is found that the gel swells more along the direction that is perpendicular to the long axis of the columnar crystals than along the direction of the long axis. Some proteins may diffuse fast along the columnar crystals.

Uses of Responsive Gels. Some diversified uses of responsive gels include solute/solvent separations, biomedical tissue applications, devices, and in NMR contrast agents. For example:

U.S. Pat. No. 5,532,006 issued to Lauterbur, et al., on Jul. 2, 1996, titled "Magnetic Gels Which Change Volume in Response to Voltage Changes for MRI," ("the '006 Patent") is specifically incorporated herein by reference. The '006 Patent disclosed compositions that are useful in nuclear magnetic resonance imaging comprising a matrix which exhibits a volume phase change in response to an electric field, the matrix containing a magnetic and preferably superparamagnetic component distributed therethrough.

U.S. Pat. No. 5,976,648 issued to Li, et al., on Nov. 2, 1999, titled "Synthesis and Use of Heterogeneous Polymer Gels" ("the '648 Patent") is specifically incorporated herein by reference. The '648 Patent disclosed a heterogeneous polymer gel comprising at least two gel networks. One embodiment of the present invention concerns a heterogeneous polymer gel comprising a first gel network comprising an environmentally-stable gel and a second gel network comprising an environmentally-unstable gel wherein the first gel network interpenetrates the second gel network. The heterogeneous polymer gel exhibits controlled changes in volume in response to environmental changes in condition, such as of temperature or of chemical composition.

U.S. Pat. No. 5,062,841 issued to Siegel on Nov. 5, 1991, titled "Implantable, Self-Regulating Mechanochemical Insulin Pump," ("the '841 Patent") is specifically incorporated herein by reference. The '841 Patent disclosed an implantable pump for the delivery of insulin to a mammal has a biocompatible housing which supports an aqueous-swellable glucose-sensitive member and a chamber containing a pharmaceutically acceptable insulin composition. The aqueous-swellable member is exposed to the body fluids which surround the pump when it is implanted; it initiates an insulin pumping cycle by swelling in response to an increase in blood glucose level and terminates an insulin pumping cycle by deswelling in response to the decrease in blood glucose level. When the glucose-sensitive aqueous-swellable member swells in response to an increase in blood glucose level, it generates a hydraulic force which causes insulin composition to be expelled from the chamber through a pressure-sensitive one way valve. The valve seals the chamber when the hydraulic force is withdrawn by deswelling of the glucose-sensitive aqueous-swellable member.

U.S. Pat. No. 4,912,032 issued to Hoffman, et al., on Mar. 27, 1990, titled "Methods for Selectively Reacting Ligands Immobilized Within a Temperature-Sensitive Polymer Gel," ("the '032 Patent") is specifically incorporated herein by reference. The '032 Patent discloses methods for delivering substances into, removing substances from, or reacting substances with a selected environment utilizing polymer gels or coatings characterized by a critical solution temperature (CST) are disclosed. The CST as well as the pore structure, pore size, pore distribution, and absorbing capacity of the gel may be selectively controlled. The substances may be physically or chemically immobilized within the polymer gels. In addition, a method for altering the surface wettability of CST polymers is also disclosed.

U.S. Pat. No. 4,555,344 issued to Cussler on Nov. 26, 1985, and titled "Method of Size-Selective Extraction from Solutions," ("the '344 Patent") is specifically incorporated herein by reference. The '344 Patent disclosed a separation method utilizing the ability of cross-linked ionic polymer gels to selectively extract solvent from a solution of a macromolecular material. A feed solution containing macromolecules is added to a small amount of basic or warm gel. The gel swells, absorbing the low molecular weight solvent, but cannot absorb the large macromolecules. The raffinate, which is now a concentrated macromolecular solution, is drawn off. To regenerate, a little acid is added to the filtered gel, or the gel is cooled, so its volume decreases sharply. The solvent is expelled from the shrinking gel and is then drawn off, leaving only the collapsed gel. A base is added to the gel, or the gel is warmed. More feed solution is added, and the cycle is begun again.

The primary scope of the present invention relates to the compositions and production methods for columnar hydrogel colloidal crystals in a water-organic solvent mixture.

SUMMARY

The present invention comprises 1) The processes, techniques and apparatus for synthesizing of columnar microgel colloidal crystals by mixing an aqueous suspension of microgels with organic solvent, 2) The stabilization of columnar crystalline structures by covalently bonding neighboring particles, and 3) Novel hydrogel materials that have anisotropic swelling properties.

It is difficult to grow columnar crystals by natural sedimentation of hydrogel colloids (or microgels) in water alone. This new method leads to microgel colloidal crystals of several centimeters growing from the top to the bottom along the gravity direction. A phase diagram has been found and it can be used as a guide to selectively grow different crystals including columnar crystals, randomly oriented crystals, and co-existence of columnar crystals and randomly oriented crystals.

One aspect of the current invention is a method of making a colloidal crystal material. This method comprises mixing an aqueous suspension of polymer matrix microgels with dichloromethane, forming a polymer matrix microgel/dichloromethane mixture. The polymer matrix microgel/dichloromethane mixture is then incubated for a period of time in a temperature range that allows the formation of the colloidal crystal material. In a preferred embodiment, the aqueous suspension of polymer matrix microgels comprises poly-N-isopropylacrylamide ("PNIPAM")-co-allylamine microgels that are in a concentration range above about 2.0 wt %. When the concentration range is in the range of about 2.7 to about 3.5 wt %, conditions are satisfactory for forming nearly only columnar crystals. However, when the concentration range is above 4.5 wt %, conditions are satisfactory for forming randomly oriented crystalline structures. Alternative polymer matrix microgels include poly-hydroxypropylcellulose, polyvinyl alcohol, polypropylene oxide, polyethylene oxide, polyethylene oxide/polypropylene oxide copolymers, or other known hydrogel polymer matrixes. Generally, the polymer matrix microgels have an average hydrodynamic radius of about 75 nm to about 175 nm at about 22° C., and the preferred hydrodynamic radius is about 135 nm. In a second preferred embodiment, the aqueous suspension of polymer matrix microgels and dichloromethane are mixed in a ratio of about 1: (0.15 to 0.30), and in a preferred range of about 1: (0.20-0.27). The columnar crystals start to become visible at about 2 hours after mixing the polymer matrix with the organic solvent. The columnar crystals continue to grow longer in the direction of gravity and can by longer than 1.5 cm after about 100 hours of incubation. The columnar crystals can be stabilized by diffusing a cross-linking agent into the colloidal crystal material forming a stabilized columnar crystal hydrogel. In a preferred embodiment a glutaric dialdehyde solution is used as a cross linking agent, however, other useful cross-linking agents include methylene-bisacrylamide, divinylsulfone related analogs, 1-ethyl-3-(3-dimethylaminopropyl)carbodiimide hydrochloride ("EDC"), adipic acid dihydrazide or other related analogs.

A second aspect of the current invention is a colloidal crystal material produced by a method that includes mixing an aqueous suspension of poly-N-isopropylacrylamide ("PNIPAM")-co-allylamine microgels with dichloromethane, forming a PNIPAM-co-allylamine/dichloromethane mixture. The PNIPAM-co-allylamine/dichloromethane mixture is incubated for a period of time at a temperature, forming the colloidal crystal material. The colloidal crystals can be stabilized by diffusing a glutaric dialdehyde solution into the colloidal crystal material. When the concentration range of the PNIPAM-co-allylamine microgels are in the range of the about 2.7 to about 3.5 wt %, conditions are satisfactory for forming nearly only columnar crystals. However, when the concentration range is above 4.5 wt %, conditions are satisfactory for forming randomly oriented crystalline structures. The preferred hydrodynamic radius for the PNIPAM-co-allylamine microgels are about 135 nm. The aqueous suspension of PNIPAM-co-allylamine microgels and dichloromethane are mixed in a ratio of about 1: (0.20-0.27). The columnar crystals start to become visible at about 2 hours after mixing the PNIPAM-co-allylamine microgels with the dichloromethane organic solvent. The columnar crystals continue to grow longer in the direction of gravity and can by longer than 1.5 cm after about 100 hours of incubation.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION OF PREFERRED EMBODIMENTS

Terms: It will be readily apparent to one skilled in the art that various substitutions and modifications may be made in the invention disclosed herein without departing from the scope and spirit of the invention.

The term "a" or "an" as used herein in the specification may mean one or more. As used herein in the claim(s), when used in conjunction with the word "comprising", the words "a" or "an" may mean one or more than one. As used herein "another" may mean at least a second or more.

The term "colloid gel" as used herein includes a colloid in a more solid form than a sol.

The term "crystal" as used herein includes a solidified form of a substance in which the atoms or molecules are arranged in a definite pattern that is repeated regularly in three dimensions: crystals tend to develop forms bounded by definitely oriented plane surfaces that are harmonious with their internal structures.

The term "hydrogel" as used herein includes a colloidal gel in which water is the dispersion medium.

The term "columnar phase" as used herein includes a liquid crystal phase characterized by disc-shaped molecules that tend to align themselves in vertical columns.

EXAMPLES

The following examples are provided to further illustrate this invention and the manner in which it may be carried out. It will be understood, however, that the specific details given in the examples have been chosen for purposes of illustration only and not be construed as limiting the invention.

Example 1

The materials used to produce columnar microgel crystals are as follows: N-Isopropylacrylamide (NIPAM) was purchased from Polyscience Co. and recrystallized from hexanes and dried in air prior to use. N,N'-methylene-bis-acrylamide (Bio-Rad Co.), potassium persulfate, sodium dodecyl sulfate, dichloromethane and allylamine (Aldrich) were used as received. Water for all reactions, solution preparation, and polymer purification was distilled and purified to a resistance of 18.2 MΩcm using a MILLIPORE system, and filtered through a 0.22 μm filter to remove particulate matter.

Figure 1:
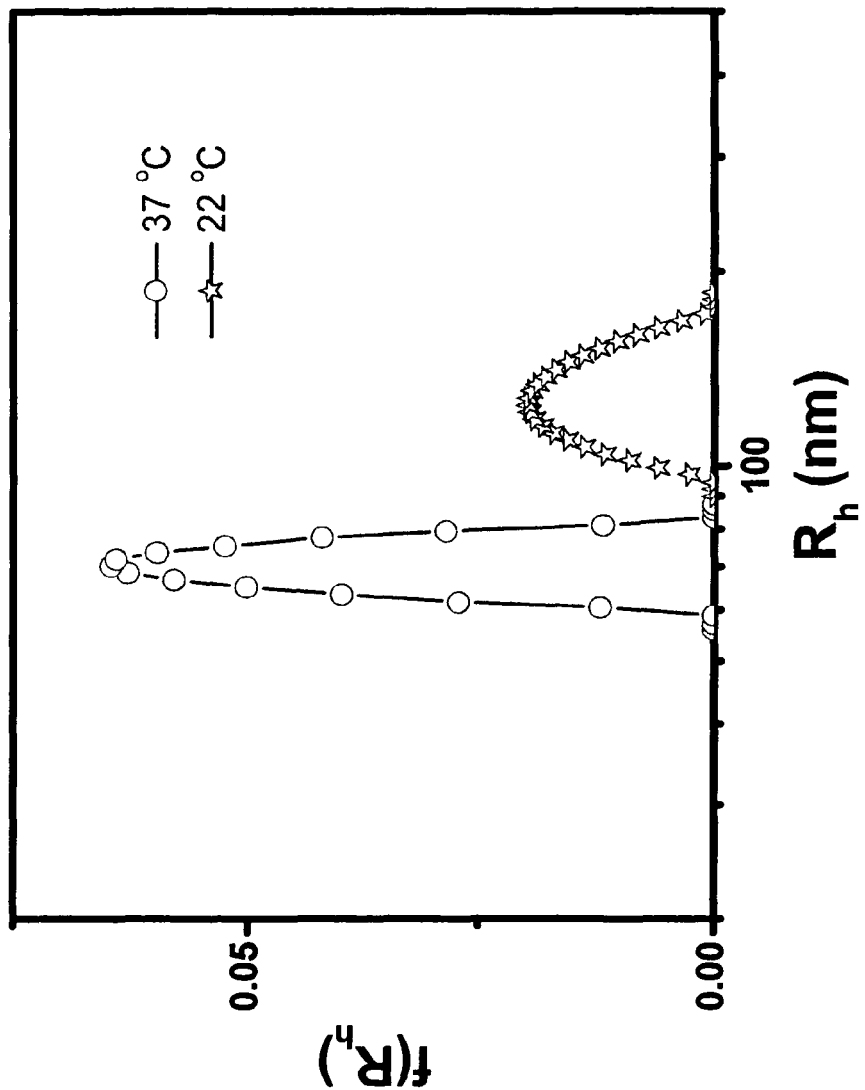
FIG. 1 shows the hydrodynamic radius distributions of PNIPAM-co-allylamine microgels in water at 22° C. and 37° C., respectively. Here the polymer concentration is $1.5 \times 10^{-5}$ g/g and the scattering angle is 60°.

In one embodiment, the preparation of monodispersed poly-N-isopropylacrylamide (PNIPAM)-co-allylamine colloidal spheres was as follows: Monodispersed poly-N-isopropylacrylamide (PNIPAM)-co-allylamine colloidal spheres were prepared using precipitation polymerization.[25] NIPAM monomer (3.8 g, 33.6 mmol), allylamine (0.2 g, 3.4 mmol, 10 mol % of NIPAM monomer), sodium dodecyl sulfate (0.08 g, 0.28 mmol) and N,N'-methylene-bis-acrylamide (0.067 g, 0.44 mmol, 1.3 mol % of NIPAM monomer) in water (240 ml) at room temperature were purged with nitrogen and stirred for 30 min, and then heated to 60° C. Potassium persulfate (0.166 g) in 10 ml water was added to the reactor to initialize polymerization. The reaction was maintained at 59-61° C. under nitrogen for 5 h. After cooling to room temperature, the resultant microgels were dialyzed for 2 weeks to remove surfactant and un-reacted molecules. The dialysis water was changed three times every day. The cutoff molecular weight of the dialysis membrane was 13,000. After dialysis, PNIPAM-co-allylamine microgels were concentrated by ultra-centrifugation at 40,000 rpm for 2 hours and re-dispersed with DI water to a certain concentration. The solid concentration of the suspension was obtained by completely drying at 80° C. in air and weighed. These particles showed the phase behavior similar to that of a pure PNIPAM gel [26] with a slightly higher volume phase transition temperature around 35° C. The average hydrodynamic radius of the particle was about 135 nm at 22° C. with polydispersity index (PD.I) about 1.08 and shrank to 65 nm at 37° C. with PD.I about 1.01 (FIG. 1).

The PNIPAM-co-allylamine microgel columnar crystals were prepared by adjusting the centrifuged particle suspension to concentrations ranging from about 1.8 to about 4.5 wt %. The defined amounts of dichloromethane ($CH_2Cl_2$) 0.27 g with 1 g particle suspension were mixed by shaking for two minutes. The mixture was put into an incubator. The crystal formation was observed at each temperature for several days.

Dynamic light scattering measurements: A commercial laser light scattering spectrometer (ALV, Co., Germany) was used with a helium-neon laser (Uniphase 1145P, output power of 22 mW and wavelength of 632.8 nm) as the light source. The hydrodynamic radius distribution of the PNIPAM-co-allylamine microgels in water was measured at the scattering angle of 60°.

UV-Visible spectroscopy measurements: The turbidity ($\alpha$) of the gels was measured as a function of the wavelength using a diode array UV-Visible spectrometer (Agilent 8453) by calculating the ratio of the transmitted light intensity ($I_t$) to the incident intensity ($I_o$) $\alpha = -(1/d)\ln(I_t/I_o)$, where d is the thickness (1 mm) of the sampling cuvet

Example 2

Figure 2:
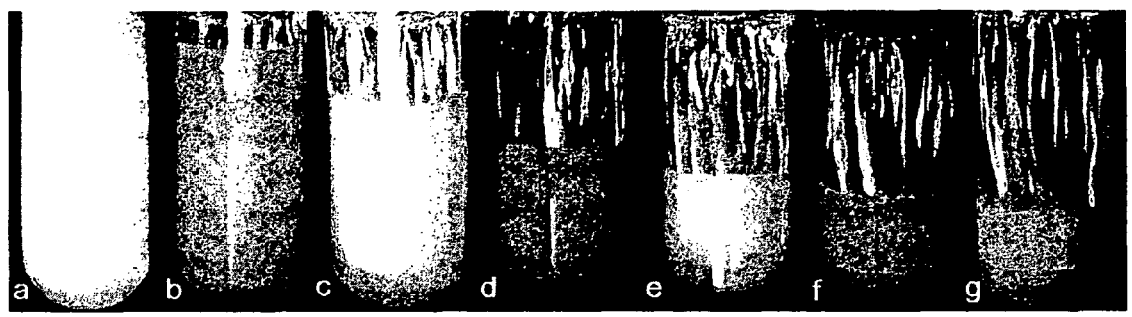
FIG. 2 shows the time dependent growth of columnar crystals in the mixture of the aqueous suspension of PNIPAM-co-allylamine microgels and dichloromethane. The time started after homogenization: a) 0, b) 4, c) 33, d) 43, e) 55, f) 72, and g) 82 hours.

The growth of columnar microgel crystals and the kinetics of crystal growth was determined. An aqueous suspension of PNIPAM-co-allylamine microgels with polymer concentration 3.5 wt % was then mixed with dichloromethane by shaking at 22° C. All samples contain the microgels with the average hydrodynamic radius of 135 nm and have the same suspension to oil ratio of 1:0.27. After homogenization, the mixture was left to stand. This initial mixture (FIG. 2a) appeared cloudy. The outside diameter of test tubes is 1.0 cm. Within about 4 hours (FIG. 2b), small columnar crystals were observed growing from the top to the bottom, which was in contrast to the hard sphere system that grew from the bottom to the top.[2] The crystals grew longer with time along the direction of gravity and reached about 1.5 cm after 82 hours (FIG. 2g). The mixture can be generally divided into three portions: the top portion is the crystal phase, the bottom portion (cloudy) is un-emulsified organic solvent, and the middle portion is unstable water-oil emulsion (cloudy and white).

Figure 3:
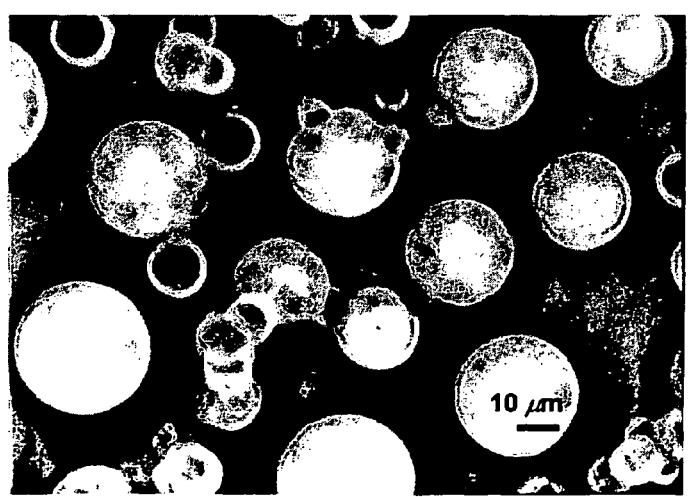
FIG. 3 shows the optical microscopic picture of the mixture of an aqueous suspension of PNIPAM-co-allylamine microgels and dichloromethane. The sizes of oil droplets coated with microgels range from 10 to 40 µm. There is not enough resolution to see microgels in this microscopic picture.

Although not wanting to be bound by theory, the mixture apparently formed an un-stable oil-in-water emulsion with "micelles" consisting of organic oil droplets coated by many microgels. This suggestion is not unreasonable when considering that the PNIAPM particles have been used as emulsifiers.[27] Using an optical microscope, the sizes of the "micelles" were found to range from 10 to 40 μm (FIG. 3). As a note, there is not enough resolution in FIG. 3 to see microgels in this optical microscopic picture. However, previous SEM measurements supported that PNIPAM microgels can cover the surfaces of oil droplets.[27] Because limited emulsifying ability of PNIPAM particles, un-emulsified oil quickly sink to form an oil phase in the bottom. These "micelles", which are heavier than water due to higher mass density of organic solvent (1.33 g/ml), gradually sink to the bottom of the cuvette. The mismatch of surface tension between particle-oil and the oil-water, results in coarsening. When such coarsening occurs, the microgels at the surface of the micelles are released. These released particles self-assemble into columnar crystals that originate in the interface between the mixture and air.

Figure 4:
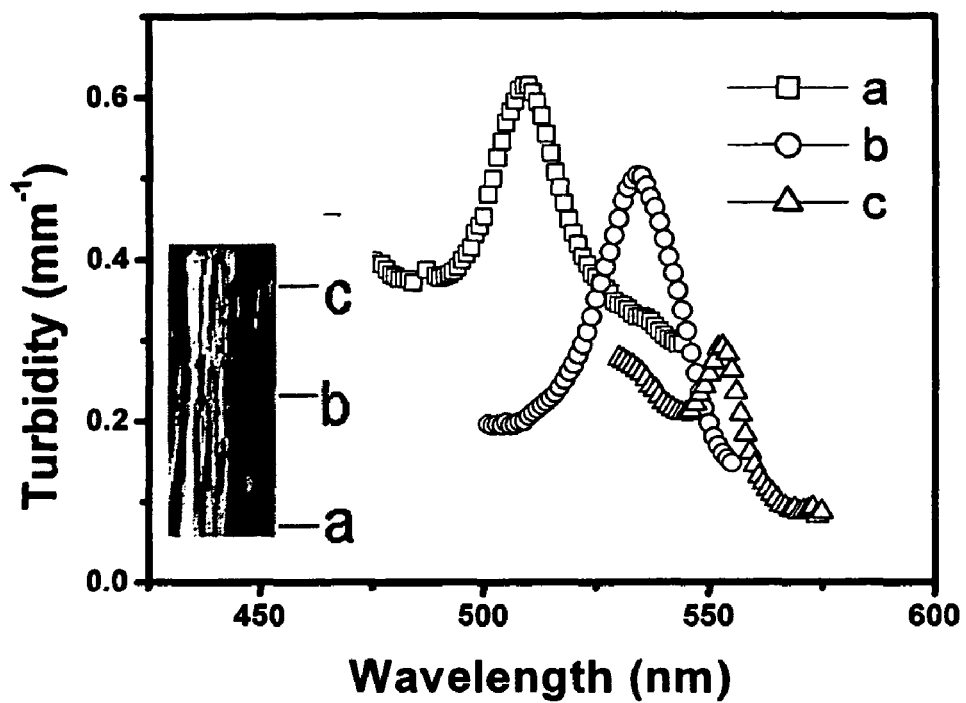
FIG. 4 shows the UV-visible spectra of the PNIPAM-co-allylamine microgel columnar crystals at three locations (The width of the inset is 1.0 cm). The peak shifts to shorter wavelength as the crystals grow from the top to the bottom.
Figure 5:
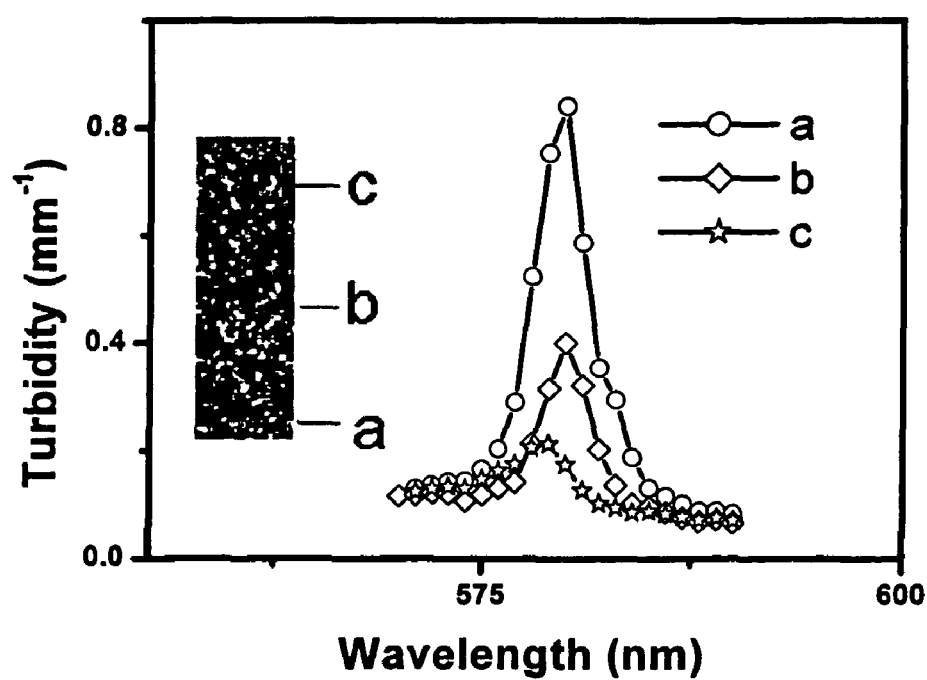
FIG. 5 shows the UV-visible spectra of the PNIPAM-co-allylamine microgel randomly oriented crystals, prepared in pure water, at three locations (The width of the inset is 1.0 cm). The peak position does not change with the location in the crystals.

The colors observed from columnar crystals are due to diffraction from the ordered colloidal arrays with a lattice spacing on the order of the wavelength of visible light according to the Bragg's law: $2nd\sin\theta = m\lambda$, where n is the mean refractive index of the suspension, $\theta$ is the diffraction angle, d is the lattice spacing, m is the diffraction order, and $\lambda$ is the wavelength of the diffracted light.[6] FIG. 4 shows the UV-visible spectra at three locations of columnar crystals. The peak position shifts to shorter wavelengths from the top to the bottom part of the columnar crystals. This indicates that the interparticle spacing of the bottom is smaller than that of the top. In contrast, for randomly oriented crystals, prepared in pure water, the peak position does not change with the location in the crystals (FIG. 5).

Example 3

Figure 6:
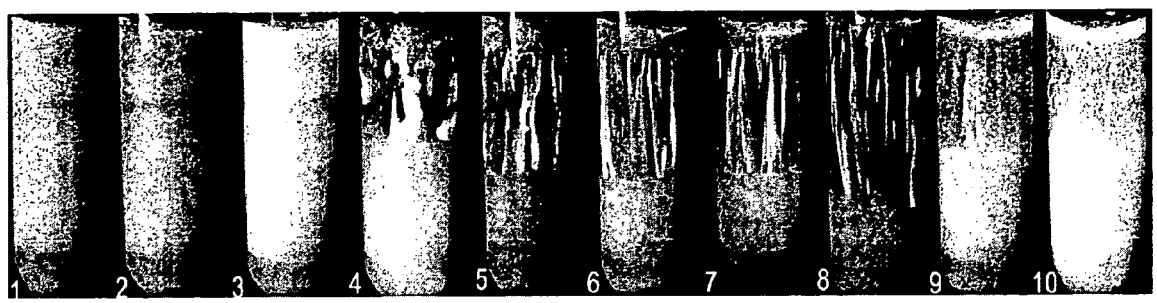
FIG. 6 shows the mixtures of the aqueous suspension of PNIPAM-co-allylamine microgels and dichloromethane at various PNIPAM concentrations at 22° C.: 1) 1.8, 2) 2.0, 3) 2.2, 4) 2.5, 5) 2.7, 6) 3.0, 7) 3.2, 8) 3.5, 9) 4.0, and 10) 4.5 wt %.
Figure 7:
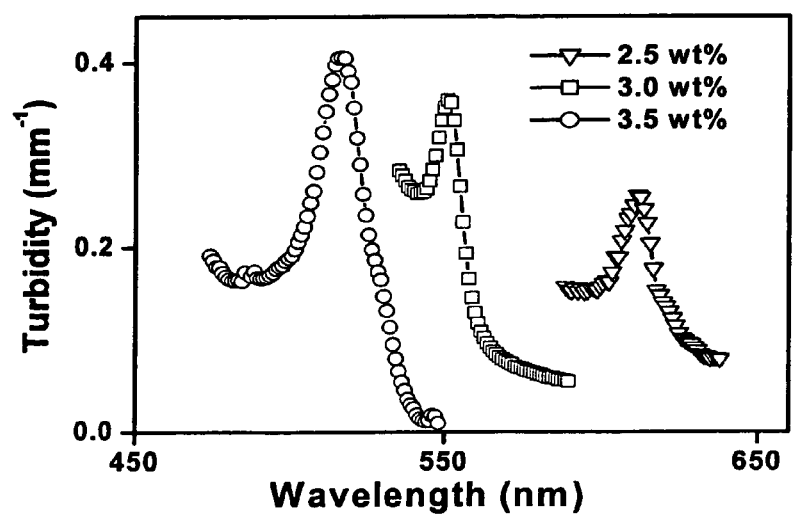
FIG. 7 shows the UV-visible spectra of columnar colloidal crystals at 2.5, 3.0 and 3.5 wt % at 22° C.

Different morphologies of columnar colloidal crystals can be obtained by changing polymer concentration. For example, FIG. 6 shows mixtures of the aqueous suspension of PNIPAM-co-allylamine microgels with dichloromethane at various PNIPAM polymer concentrations ranging from 1.8 to 4.5 wt % at 22° C. For samples below 2.0 wt % (FIG. 6(1-2)), no crystallization was observed. Near 2.2 wt % (FIG. 6(3)), conventional, randomly oriented crystalline domains appeared. For samples near 2.5 wt % (FIG. 6(4)), there was a co-existent region of columnar crystals and conventional crystal domains. For samples with polymer concentration between 2.7 and 3.5 wt % (FIG. 6(5-8)), columnar crystals were observed. In this concentration range, the color of the columnar crystals changed from red to blue as polymer concentration increases. UV-visible spectra on these crystals at the same location also demonstrated that the peak position shifts to a shorter wavelength with the increase of the polymer concentration (FIG. 7), due to the decrease of inter-particle spacing. Near 4.0 wt % (FIG. 6(9)), a co-existent region of columnar crystals and randomly oriented crystalline domains was observed. At 4.5 wt % (FIG. 6(10)), only randomly oriented crystalline domains were observed. Additionally, the current method could be used to row randomly oriented crystalline domains at high polymer concentrations at room temperature, while the previous method relies on the heating-cooling cycles.[14, 28]

Figure 8:
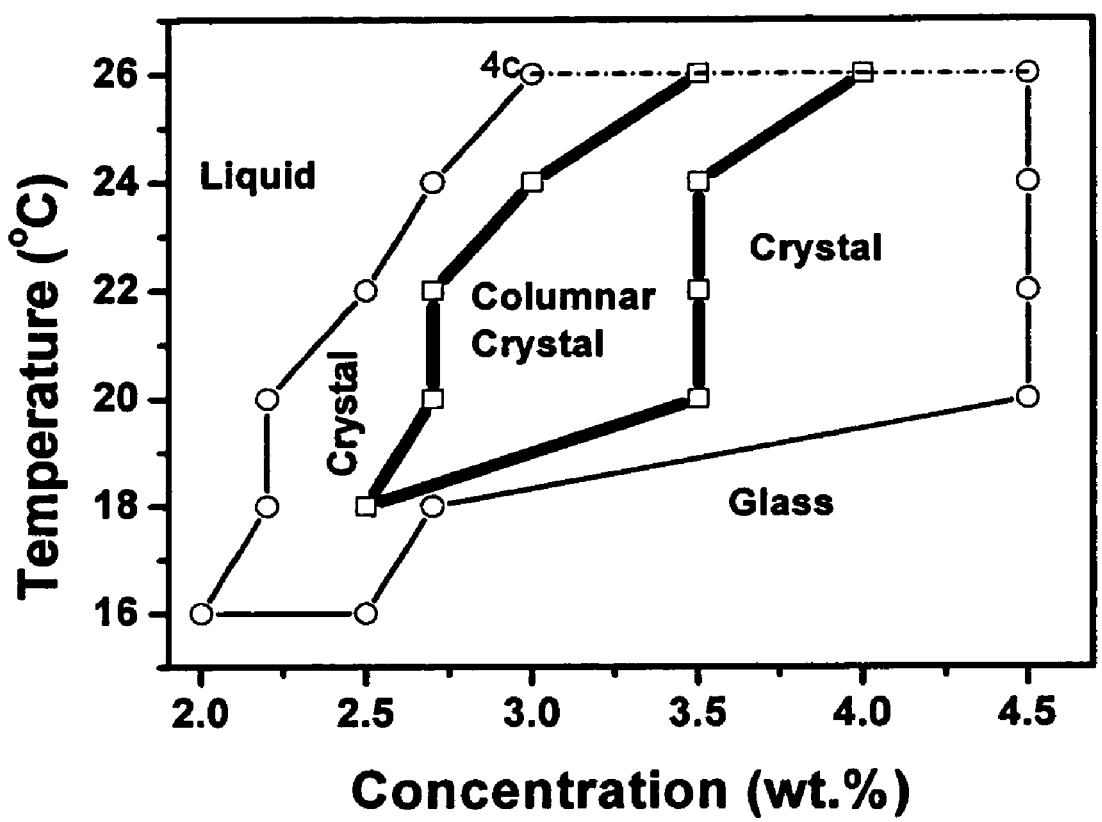
FIG. 8 shows the phase diagram of the mixtures of the aqueous suspension of PNIPAM-co-allylamine microgels and dichloromethane as a function of polymer concentration and temperature.

Both temperature and polymer concentration have been utilized and measured for the formation of columnar crystals. FIG. 8 shows a phase diagram of the mixtures of the aqueous suspension of PNIPAM-co-allylamine microgels with dichloromethane. The phase behavior has been divided into four areas: liquid, (randomly oriented) crystal, columnar crystal, and glass. The columnar crystals and randomly oriented crystals co-exist phases are indicated with thick blue lines. In the liquid phase region, the top portion of the mixture flows easily, while in the glass phase region it cannot flow. Growth kinetics of columnar crystals depends strongly on temperature. At 22° C., it took about two or three days for crystals to grow to 1 cm long. However, above 26° C., no crystals were observed after seven days.

Example 4

Stabilizing a columnar crystal structure can be achieved by bonding neighboring particles. The direct use of PNIPAM columnar colloidal crystals is limited because the structure can be easily destroyed by any external disturbance such as vibrations. To solve this problem, the stabilization of columnar crystalline hydrogels by bonding particles into a network has been used.

Monodispersed poly-N-isopropylacrylamide (PNIPAM)-co-allylamine colloidal spheres were prepared using precipitation polymerization as described in Example 2. The centrifuged particle dispersion was adjusted to polymer concentration ranging from 3.5 wt % to 4.23 wt %. The defined amounts of dichloromethane ($CH_2Cl_2$) 0.2 g with 1 g particle dispersion were mixed by a mixer for 2 minutes. The mixture was put into 23° C. incubator and the columnar crystals were formed in about 2 to 3 days. After the crystals were formed, the dispersion was put into an incubator with a temperature of 4° C. for about 24 hours. Then glutaric dialdehyde (0.04 g, 25 wt.%) solution was added to the top of the dispersion. This reagent was diffused through the dispersion to act as cross-linker. The particle assembly with columnar crystalline structure was stabilized by the cross-linking reaction for about two days in incubator having a temperature of about 4° C. The cross-linked columnar crystal gel was removed from the test tube by injecting water into bottom of the tube with a syringe. After measured the turbidity by UVNis spectrophotometer (Agilent 8453) and the gel size, the gel was immersed in DI water for 1 week to balance the gel. During the balancing period, the DI water was changed three times every day to remove un-reacted glutaric dialdehyde.

Figure 9:
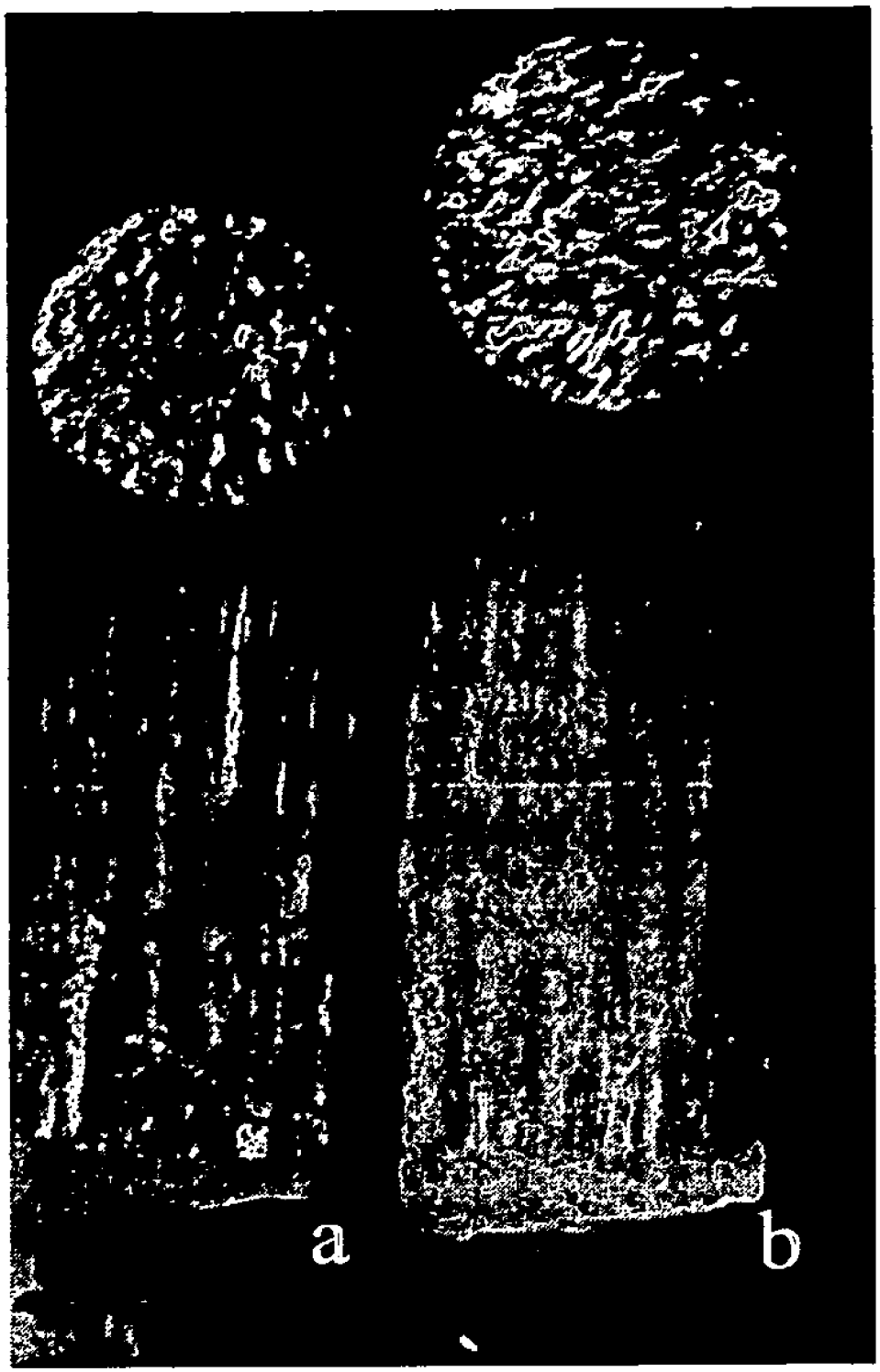
FIG. 9 shows the hydrogel with columnar crystals with polymer concentration of 4.23 wt %. (a) The hydrogel was just taken out from a test tube and immersed in water. (b) The same hydrogel reached a fully swollen state after five days. The gel swollen more along the direction that is perpendicular to the long axis of the columnar crystals than along the direction of the long axis.

The anisotropic properties of hydrogels with columnar crystals was determined. Conventional hydrogels swell or shrink isotropically. However, this isotropic symmetry is broken for hydrogels with columnar crystals. FIG. 9 shows swelling behavior of the columnar crystal hydrogel with 4.23 wt % polymer concentration. FIG. 9a shows the hydrogel was just taken out from the test tube. After 5 days, the gel reached a fully swollen state (FIG. 9b). As one can see from the pictures, the gel swollen more along the direction that is perpendicular to the long axis of the columnar crystals than along the direction of the long axis.

Figure 10:
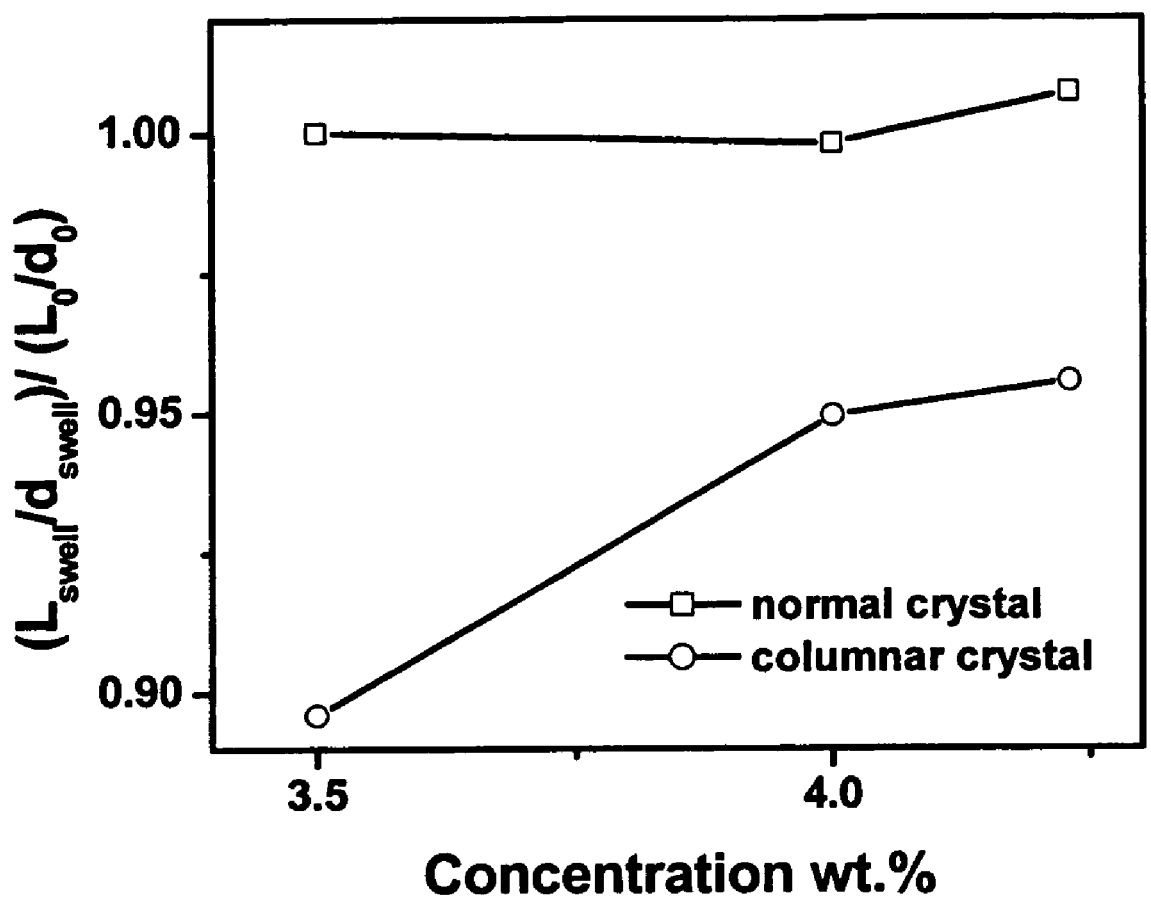
FIG. 10 shows the ratio (length to diameter) of the swollen hydrogels with columnar crystals (the blue line). A controlled experiment showed that for randomly oriented crystalline hydrogels, this ratio of (L/D) is always equal to one (the dark line).

If we define the ratio of gel's length (L) to diameter (D) as an anisotropic parameter. If this ratio is one, the gel swells isotropically. If this ratio is not equal to one, the gel swells anisotropically. It is found that for columnar crystal gels, the ratio of L/D is smaller than one and decreases from 0.95 to 0.89 as the polymer concentration decreases from 4.23% to 3.5% (FIG. 10, blue line). A controlled experiment showed that for randomly oriented crystalline hydrogels, this ratio of (L/D) is always equal to one (FIG. 10, the dark line).

As an alternative, the formation of columnar crystal hydrogels, microgels can utilize : NIPAM co-polymerize with monomers that contain amine group, or carboxyl, or hydroxyl group such as allylamine, 2-hydroxyethyl acrylate, 2-aminoethyl methacrylate hydrochloride, N-(3-aminopropyl)methacrylamide hydrochloride, acrylic acid, or any above two functional groups. Additionally, alternative organic solvents include $C_nH_{(2n+2-y)}X_y$ (where X=F, Cl, I, Br and n=1, 2, 3 ... and y=1, 2, 3, ... ) such as methane chloromethane, dichloromethane, chloroform, carbon tetrachloride, 1,2-dichloroethane, etc.

One skilled in the art readily appreciates that this invention is well adapted to carry out the objectives and obtain the ends and advantages mentioned as well as those inherent therein. The compositions, methods, procedures and techniques described herein are presently representative of the preferred embodiments and are intended to be exemplary and are not intended as limitations of the scope. Changes therein and other uses will occur to those skilled in the art which are encompassed within the spirit of the invention or defined by the scope of the pending claims.

REFERENCES CITED

The following references, to the extent that they provide exemplary procedural or other details supplementary to those set forth herein, are specifically incorporated herein by reference.

U.S. PATENT DOCUMENTS

U.S. patent application Ser. No. 10/295,484 filed by Hu et al., on Nov. 15, 2001 and titled "Synthesis, Uses and Compositions of Crystal Hydrogels."

U.S. Pat. No. 5,532,006 issued to Lauterbur, et al., on Jul. 2, 1996, titled "Magnetic Gels Which Change Volume in Response to Voltage Changes for MRI."

U.S. Pat. No. 5,976,648 issued to Li, et al., on Nov. 2, 1999, titled "Synthesis and Use of Heterogeneous Polymer Gels."

U.S. Pat. No. 5,062,841 issued to Siegel on Nov. 5, 1991, titled "Implantable, Self-Regulating Mechanochemical Insulin Pump."

U.S. Pat. No. 4,912,032 issued to Hoffman, et al., on Mar. 27, 1990, titled "Methods for Selectively Reacting Ligands Immobilized Within a Temperature-Sensitive Polymer Gel."

U.S. Pat. No. 4,555,344 issued to Cussler on Nov. 26, 1985, and titled "Method of Size-Selective Extraction from Solutions."

REFERENCES:

[1] R. N. Pusey, M. van Megen, Nature 1986, 320, 340.
[2] K. E. Davis, W. B. Russel, W. J. Glantschnig, Science 1989, 245, 507.
[3] B. J. Ackerson, S. E. Paulin, B. Johnson, W. van Megen, S. Underwood, Phys. Rev. E, 1999, 59, 6903.
[4] J. Yamanaka, M. Murai, Y. Iwayama, M. Yonese, K. Ito, T. Sawada, J. Am. Chem. Soc. 2004, 126, 7156.
[5] P. Jiang, J. F. Bertone, K. S. Hwang, V. L. Colvin, Chem. Mater. 1999, 11, 2132.
[6] M. Weissman, H. B. Sunkara, A. S. Tse, S. A. Asher, Science 1996, 274, 959.
[7] A. Van Blaaderen, R. Ruel, P. Wiltzius, Nature 1997, 385, 321.
[8] Z. Cheng, W. B. Russel, P. M. Chaikin, Nature, 1999, 401, 893.
[9] S. H. Park, D. Qin, Y. Xia, Adv. Mater. 1998, 10, 1028.
[10] Y. Yin, Y. Xia, J. Am. Chem. Soc 2003; 125, 2048.
[11] J. E. Smay, J. Cesarano, J. A. Lewis, Langmuir, 2002, 18, 5429.
[12] C. Lellig, W. Hartl, J. Wagner, and R. Hempelmann, Angew. Chem. Int. Ed. 2002, 41, 102.
[13] H. Senff, W. Richtering, J. Chem. Phys. 1999, 111, 1705.
[14] J. D. Debord, S. Eustis, S. B. Debord, M. T. Lofye, L. A. Lyon, Adv. Mater. 2002, 14, 658.
[15] Z. B. Hu, X. Lu, J. Gao, Adv. Mater. 2001, 13, 1708.
[16] S. J. Tang, Z. B. Hu, Z. D. Cheng, J. Z. Wu, Langmuir 2004, 20, 8858.
[17] N. A. Peppas, R. Langer, Science 1994, 263, 1715.
[18] T. Tanaka, I. Nishio, S. T. Sun, S. Ueno-Nishio, Science 1982, 218, 467.
[19] R. A. Siegel, B. A. Firestone, Macromolecules 1988, 21, 3254.
[20] G. Chen, A. S. Hoffman, Nature 1995, 373, 49.
[21] Y. Osada, J. P. Gong, Adv. Mater. 1998, 10, 827.
[22] M. J. Snowden, M. J. Murray and B. Z. Chowdry, Chemistry & Industry 1996, 531.
[23] C. Wang, R. J. Stewart and J. Kopecek, Nature 397, 417 (1999).
[24] A. Lendlein, S. Kelch, Angew. Chem. Int. Ed. 2002, 41, 2034.
[25] R. H. Pelton, P. Chibante, Colloids Swf. 1986, 20, 247.
[26] Y. Hirotsu, T. Hirokawa, T. Tanaka, J. Chem. Phys. 1987, 87, 1392.
[27] T. Ngai, S. H. Behrens, H. Auweter, Chem. Commun. 2005, 3, 331.
[28] Z. B. Hu, G. Huang, Angew. Chem. Int. Ed., 2003, 42, 4799.

What is claimed:

1. A method of making a colloidal crystal material comprising:
    (a) mixing an aqueous suspension of polymer matrix microgels with dichloromethane, forming a polymer matrix microgel/dichloromethane mixture; and
    (b) incubating the polymer matrix microgel/dichloromethane mixture for a period of time at a temperature, forming the colloidal crystal material;
    wherein the aqueous suspension of polymer matrix microgels are in a concentration range above about 2.0 wt %.

2. The method of claim 1, wherein the polymer matrix microgels comprises poly-N-isopropylacrylamide ("PNIPAM")-co-allylamine microgels.

3. The method of claim 1, wherein the polymer matrix microgels comprises poly-hydroxypropylcellulose, polyvinyl alcohol, polypropylene oxide, polyethylene oxide, or polyethylene oxide/polypropylene oxide copolymers.

4. The method of claim 1, wherein the polymer matrix microgels have an average hydrodynamic radius of about 75 nm to about 175 nm at about 22° C.

5. The method of claim 1, wherein the aqueous suspension of polymer matrix microgels are in a concentration range of about 2.7 to about 3.5 wt %, forming a columnar crystal concentration range.

6. The method of claim 1, wherein the aqueous suspension of polymer matrix microgels are in a concentration range of above 4.5 wt %, forming a randomly oriented crystalline concentration range.

7. The method of claim 1, wherein the aqueous suspension of polymer matrix microgels and dichloromethane are mixed in a ratio of about 1:(0.15 to 0.30).

8. The method of claim 1, wherein the period of time was in the range of about 2 hours to about 100 hours.

9. The method of claim 1, further comprising, diffusing a cross-linking agent into the colloidal crystal material forming a stabilized columnar crystal hydrogel.

10. The method of claim 7, wherein the cross-linking agent comprises a glutaric dialdehyde solution.

11. The method of claim 7, wherein the cross-linking agent comprises a methylene-bis-acrylamide, divinylsulfone related analogs, 1-ethyl-3-(3-dimethylaminopropyl)carbodiimide hydrochloride ("EDC"), or adipic acid dihydrazide.

12. A colloidal crystal material produced by a method comprising:
    (a) mixing an aqueous suspension of poly-N-isopropylacrylamide ("PNIPAM")-co-allylamine microgels with dichloromethane, forming a PNIPAM-co-allylamine/dichloromethane mixture; and
    (b) incubating the PNIPAM-co-allylamine/dichloromethane mixture for a period of time at a temperature, forming the colloidal crystal material;
    wherein the aqueous suspension of PNIPAM-co-allylamine microgels are in a concentration range above about 2.0 wt %.

13. The colloidal crystal material of claim 12, wherein the PNIPAM-co-allylamine microgels have an average hydrodynamic radius of about 135 nm at about 22° C.

14. The colloidal crystal material of claim 12, wherein the aqueous suspension of PNIPAM-co-allylamine microgels are in a concentration range of about 2.7 to about 3.5 wt %.

15. The colloidal crystal material of claim 12, wherein the aqueous suspension of PNIPAM-co-allylamine microgels and dichloromethane are mixed in a ratio of about 1: (0.15 to 0.30).

16. The colloidal crystal material of claim 12, wherein the period of time was in the range of about 2 hours to about 100 hours.

17. The colloidal crystal material of claim 12, further comprising, diffusing a cross-linking agent into the colloidal crystal material forming a stabilized columnar crystal hydrogel.

18. The colloidal crystal material of claim 17, wherein the cross-linking agent comprises a glutaric dialdehyde solution or related analogs,.

19. The colloidal crystal material of claim 17, wherein the cross-linking agent comprises a methylene-bis-acrylamide, divinylsulfone related analogs, 1-ethyl-3-(3-dimethylaminopropyl) carbodiimide hydrochloride ("EDC"), adipic acid dihydrazide or other related analogs.

20. A method of making a stabilized columnar crystal hydrogel comprising:
  (a) mixing an aqueous suspension of poly-N-isopropylacrylamide ("PNIPAM")-co-allylamine microgels with dichloromethane, forming a PNIPAM-co-allylamine/dichloromethane mixture, wherein the PNIPAM-co-allylamine microgels are in a concentration range in the range of about 2.2 to about 3.7 wt % having an average hydrodynamic radius of about 135 nm at about 22° C., and wherein the aqueous suspension of PNIPAM-co-allylamine microgels and dichloromethane are mixed in a ratio of about 1:(0.20 to 0.27);
  (b) incubating the PNIPAM-co-allylamine/dichloromethane mixture for a period of time in the range of about 2 hours to about 100 hours at a temperature, forming a columnar crystal material; and
  (c) diffusing a glutaric dialdehyde cross-linking agent into the colloidal crystal material forming the stabilized columnar crystal hydrogel.

* * * * *